United States Patent
Kim

(10) Patent No.: US 8,203,218 B2
(45) Date of Patent: Jun. 19, 2012

(54) SEMICONDUCTOR DEVICE PACKAGE INCLUDING A PASTE MEMBER

(75) Inventor: Choong Youl Kim, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 181 days.

(21) Appl. No.: 12/487,127

(22) Filed: Jun. 18, 2009

(65) Prior Publication Data

US 2009/0315056 A1 Dec. 24, 2009

(30) Foreign Application Priority Data

Jun. 23, 2008 (KR) .................. 10-2008-0059069

(51) Int. Cl.
  H01L 23/48 (2006.01)
  H01L 23/52 (2006.01)
  H01L 29/40 (2006.01)
  H01L 29/22 (2006.01)
  H01L 29/227 (2006.01)
  H01L 33/00 (2010.01)
  H01L 23/495 (2006.01)

(52) U.S. Cl. ............ 257/783; 257/98; 257/99; 257/676; 257/690; 257/782; 257/784; 257/E23.018; 257/E23.02; 257/E23.166

(58) Field of Classification Search .............. 257/98–99, 257/676, 690, 782–784, E23.018, E23.02, 257/E23.166
See application file for complete search history.

(56) References Cited

U.S. PATENT DOCUMENTS

| | | | |
|---|---|---|---|
| 5,298,768 A * | 3/1994 | Okazaki et al. ............. 257/81 |
| 6,900,587 B2 * | 5/2005 | Suehiro et al. ............. 313/503 |
| 7,038,195 B2 * | 5/2006 | Kida et al. ............. 250/239 |
| 7,138,660 B2 * | 11/2006 | Ota et al. ............. 257/79 |
| 7,301,176 B2 * | 11/2007 | Abe et al. ............. 257/98 |
| 7,391,153 B2 * | 6/2008 | Suehiro et al. ............. 313/512 |
| 7,420,223 B2 * | 9/2008 | Ishidu et al. ............. 257/99 |
| 7,531,844 B2 * | 5/2009 | Matsumoto et al. ............. 257/98 |
| 7,719,021 B2 * | 5/2010 | Harrah et al. ............. 257/98 |
| 7,795,053 B2 * | 9/2010 | Ohno et al. ............. 438/26 |
| 7,897,989 B2 * | 3/2011 | Kumura ............. 257/98 |
| 7,923,740 B2 * | 4/2011 | Okamura et al. ............. 257/98 |
| 8,067,699 B2 * | 11/2011 | Sakamoto et al. ............. 174/260 |
| 2002/0063301 A1 | 5/2002 | Hanamoto et al. |
| 2002/0153835 A1 * | 10/2002 | Fujiwara et al. ............. 313/512 |
| 2003/0189830 A1 * | 10/2003 | Sugimoto et al. ............. 362/294 |

(Continued)

FOREIGN PATENT DOCUMENTS

EP 1450417 A1 8/2004

(Continued)

OTHER PUBLICATIONS

European Search Report dated Sep. 22, 2011 in European Application No. 09770336.7, filed Jun. 16, 2009.

Primary Examiner — Ida M Soward
(74) Attorney, Agent, or Firm — Saliwanchik, Lloyd & Eisenschenk

(57) ABSTRACT

A semiconductor device package is provided. The semiconductor device package includes a package body, a plurality of electrodes, a paste member, and a semiconductor device. The electrodes includes a first electrode disposed on the package body. The paste member is disposed on the first electrode and includes at least one of an inorganic filler and metal powder. The semiconductor device is die-bonded on the paste member.

17 Claims, 5 Drawing Sheets

U.S. PATENT DOCUMENTS

| | | | |
|---|---|---|---|
| 2004/0089846 A1* | 5/2004 | Matsuno | 252/301.4 S |
| 2005/0072981 A1* | 4/2005 | Suenaga | 257/88 |
| 2005/0179364 A1* | 8/2005 | Murazaki | 313/498 |
| 2006/0043407 A1 | 3/2006 | Okazaki | |
| 2006/0054913 A1* | 3/2006 | Hadame et al. | 257/99 |
| 2006/0163999 A1* | 7/2006 | Murazaki et al. | 313/485 |
| 2006/0261364 A1* | 11/2006 | Suehiro et al. | 257/100 |
| 2007/0102722 A1 | 5/2007 | Ishizaka et al. | |
| 2007/0221940 A1 | 9/2007 | Okazaki | |
| 2007/0246841 A1* | 10/2007 | Yamamoto et al. | 257/784 |
| 2008/0048201 A1* | 2/2008 | Kim et al. | 257/98 |
| 2009/0121615 A1* | 5/2009 | Le Toquin | 313/503 |
| 2009/0166665 A1* | 7/2009 | Haitko | 257/100 |
| 2010/0155769 A1* | 6/2010 | Lin et al. | 257/99 |
| 2010/0194263 A1* | 8/2010 | Winkler et al. | 313/486 |
| 2010/0264449 A1* | 10/2010 | Hayashi | 257/98 |
| 2010/0327734 A1* | 12/2010 | Hiramatsu | 313/503 |
| 2011/0085336 A1* | 4/2011 | Blumel et al. | 362/255 |
| 2011/0089455 A1* | 4/2011 | Diana et al. | 257/98 |

FOREIGN PATENT DOCUMENTS

| | | |
|---|---|---|
| JP | 10151794 A * | 6/1998 |
| JP | 11-068166 A | 3/1999 |
| JP | 2002-151744 A | 5/2002 |
| JP | 2007-173287 A | 7/2007 |
| JP | 2007-180059 A | 7/2007 |
| JP | 2008-010564 A | 1/2008 |

* cited by examiner

SEMICONDUCTOR DEVICE PACKAGE INCLUDING A PASTE MEMBER

CROSS-REFERENCE TO RELATED APPLICATION

This application claims the benefit under 35 U.S.C. §119 of Korean Patent Application No. 10-2008-0059069, filed Jun. 23, 2008, which is hereby incorporated by reference in its entirety.

BACKGROUND

The present disclosure relates to a semiconductor device package.

Light emitting diodes (LEDs) may form light emitting sources using GaAs-based, AlGaAs-based, GaN-based, InGaN-based, and InGaAlP-based compound semiconductor materials.

Such LEDs are packaged to be used as light emitting devices that emit a variety of colors. Light emitting diodes are used as light sources in diverse applications, including on/off indicators, text displays, and image displays, that depict colors.

BRIEF SUMMARY

Embodiments provide a semiconductor device package comprising a paste member that comprises reflective metal and is disposed between a semiconductor device and an electrode.

Embodiments provide a semiconductor device package comprising a semiconductor device that is die-bonded on a paste member containing reflective metal and/orand/or inorganic fillers.

Embodiments provide a semiconductor device comprising a paste member that contains reflective metal and/orand/or inorganic fillers and is disposed in a paste groove of an electrode; and an LED that is die-bonded on the paste member.

An embodiment provides a semiconductor device package comprising: a package body; a plurality of electrodes comprising a first electrode on the package body; a paste member on the first electrode and comprising at least one of inorganic fillers and metal powder; and a semiconductor device die-bonded on the paste member.

An embodiment provides a semiconductor device package comprising: a package body comprising a cavity; a plurality of electrodes comprising a first electrode in the cavity; a paste member on the first electrode and comprising white inorganic fillers and a reflective metal; at least one light emitting diode chip die-bonded on the paste member; a wire electrically connecting the electrodes to the light emitting diode chip; and a resin material in the cavity.

An embodiment provides a semiconductor device package comprising: a light emitting diode chip; a first electrode under the light emitting diode chip; a second electrode spaced apart from the first electrode; an organic paste member on the first electrode and comprising at least one of an inorganic filler and a reflective metal, the light emitting diode chip being die-bonded on the organic paste member; and a connecting member connecting the light emitting diode chip to the electrodes.

The details of one or more embodiments are set forth in the accompanying drawings and the description below. Other features will be apparent from the description and drawings, and from the claims.

DETAILED DESCRIPTION

Reference will now be made in detail to the embodiments of the present disclosure, examples of which are illustrated in the accompanying drawings.

Figure 1:
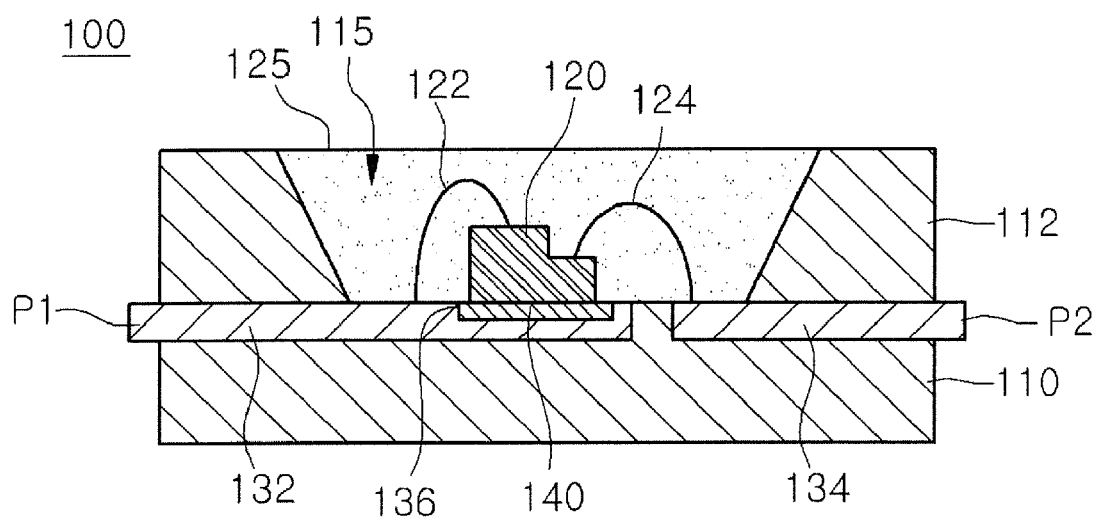
FIG. 1 is a cross-sectional view of a semiconductor device package according to a first embodiment.
Figure 2:
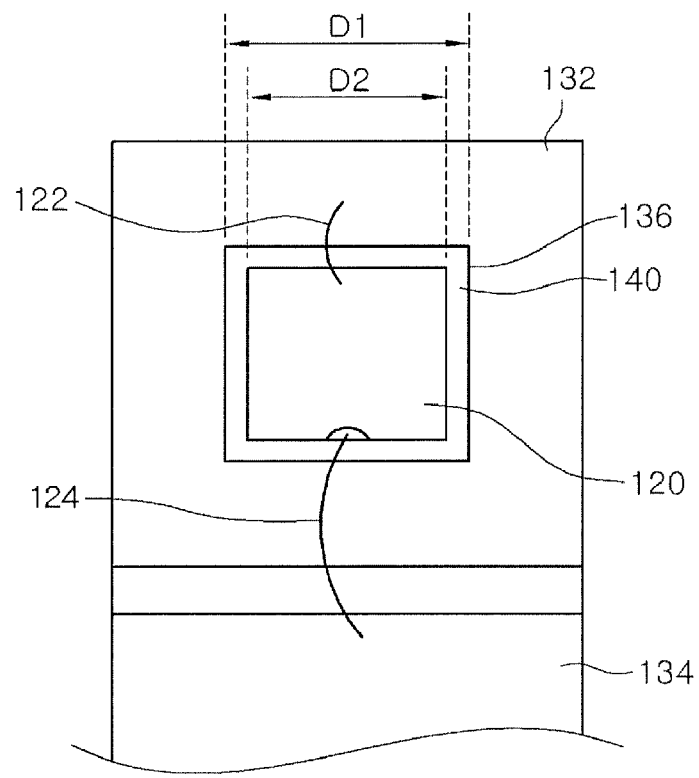
FIG. 2 is a top plan view of a first electrode on which a semiconductor device of FIG. 1 is mounted.
Figure 3:
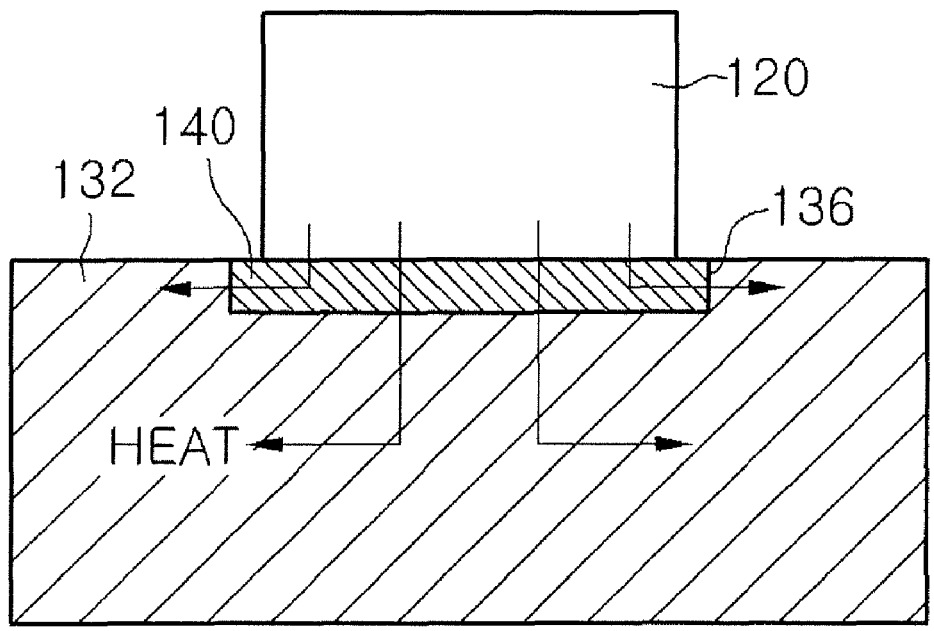
FIG. 3 is a cross-sectional view illustrating a heat dissipation path of a paste member of FIG. 1.

FIG. 1 is a cross-sectional view of a semiconductor device package according to a first embodiment, FIG. 2 is a top plan view of a first electrode on which a semiconductor device of FIG. 1 is mounted, and FIG. 3 is a cross-sectional view illustrating a heat dissipation path of a paste member of FIG. 1.

Referring to FIG. 1, a semiconductor device package 100 comprises a package body 110, a semiconductor device 120, a resin material 125, a plurality of electrodes 132 and 134, and a paste member 140.

The package body 110 may be formed of a material selected from the group consisting of polyphthalamide (PPA), liquid crystal polymer, resin-based material (e.g., syndiotactic polystyrene (SPS), a metal core printed circuit board (MCPCB), a printed circuit board (PCB), a ceramic PCB, rame retardant-4 (FR-4), and aluminum nitride (AlN). The package body 110 may be provided in the form of a chip-on-board (COB).

A cavity 115 having an opened top is formed at an upper portion 112 of the package body 110 and an inner wall of the cavity 115 may be formed to be vertical or inclined at a predetermined angle with respective to a bottom surface thereof.

The cavity 115 may be formed in a circular or polygonal shape and in a single layer cavity structure or a multi-layer cavity structure. However, the present disclosure is not limited to these configurations.

The electrodes 132 and 134 are formed in the cavity 115 of the package body 110. First ends of the electrodes 132 and 134 are disposed in the cavity 115 and second ends of the electrodes 132 and 134 are exposed to an external side of the package body 110. The second ends of the electrodes 132 and 134 may be used as external electrodes P1 and P2. The second ends of the electrodes 132 and 134 extend to a side or bottom surface of the package body 110. However, the present disclosure is not limited to this configuration. The electrodes 132 and 134 may be formed by selectively using a lead frame type, a PCB (printed circuit board) type, a ceramic type, a plating type, or a via-hole type.

The electrode 132 is provided at a first region with a paste groove 136 having a predetermined depth. The paste groove 136 may be formed through a punching process or an etching process. The paste groove 136 may be formed on the electrode 132 before or after the package body 110 is manufactured.

The paste groove 136 may be formed on the electrode 132 on which the semiconductor device 120 is attached. The following will be described with an example where the paste groove 136 is formed on the first electrode 132.

The paste groove 136 may be formed on a region where the semiconductor device 120 is die-bonded. The paste groove 136 may be formed in a circular shape, a polygonal shape, or a random shape. A depth of the paste groove 136 can be 1-100 μm from a top surface of the electrode 132.

In addition, the paste member 140 is formed in the paste groove 136. The paste member 140 may be formed through at least one of dotting, stamping, and dispensing processes.

The paste member 140 may be formed of an organic paste material containing a reflective metal. The paste member 140 may be formed by mixing an organic resin with an inorganic fillers and/or and/or a reflective metal at a predetermined ratio.

The organic resin contains silicon or epoxy resin. The inorganic fillers contain high reflective white inorganic fillers or reflective inorganic fillers such as $TiO_2$. The reflective metal may contain metal powder such as Ag and Al that are excellent in a reflective property and thermal conduction.

The paste member 140 may be formed of the organic resin mixed with 0.1-30 wt % of the inorganic fillers and/or 0.1-30 wt % of the metal powder.

The paste member 140 has a higher thermal conduction and reflective property than resin material such as epoxy, and has an equal insulation property as the epoxy. The bottom and outer circumference of the paste member 140 may surface-contact the first electrode 132.

The semiconductor device 120 is die-bonded on the paste member 140. The semiconductor device 120 comprises, for example, an LED chip. The LED chip may be a colored LED chip such as a red LED chip, a green LED chip, or a blue LED chip or an ultraviolet LED chip. The package with the LED chip may be referred to as an LED package. In addition, the semiconductor device 120 may comprise a protective device such as a Zener diode.

The paste member 140 may be designed such that at least one semiconductor device 120 may be die-bonded. The number of the semiconductor device 120 may be varied in accordance with the size of the paste groove 136.

Referring to FIG. 2, the paste member 140 has a first width D1 greater than a first width D2 of the semiconductor device 120. That is, an area of the paste member 140 may be greater than a bottom area of the semiconductor device 120.

Referring again to FIGS. 1 and 2, the semiconductor device 120 is connected to the electrodes 132 and 134 by wires 122 and 124.

The resin material 125 is formed in the cavity 115. The resin material 125 comprises transparent silicon or epoxy resin. Phosphors may be added to the resin material 125. A lens (not shown) formed in a predetermined shape may be attached or formed on the resin material 125.

The package body 110 may comprise a protective device (not shown) such as a Zener diode for protecting the semiconductor device 120.

Referring to FIGS. 1 and 3, electric power is supplied to the semiconductor device package 100 through the electrodes 132 and 134. The electrode 132 supplies a first polarity power to the semiconductor device 120 and the second electrode 134 supplies second polarity power to the semiconductor device 120. When the semiconductor device 120 is the LED chip, the semiconductor device 120 emits light in all directions. In this case, the semiconductor device 120 generates heat. Some of the heat generated is conducted to the paste member 140 disposed under the semiconductor device 120 and the heat conducted to the paste member 140 is dissipated through the first electrode 132.

Here, the paste member 140 surface-contacts the paste groove 136 of the first electrode 132 to dissipate the heat conducted from the semiconductor device 120 through the first electrode 132.

In addition, the paste member 140 is formed in the paste groove 136 of the first electrode 132 and disposed under the semiconductor device 120. Therefore, the contact area of the paste member 140 with the resin material 125 is reduced. Here, the paste member 140 may protrude above the first electrode 132.

Further, since the paste member 140 has a higher thermal conduction efficiency compared to the resin material, it can reduce a boundary surface temperature with the semiconductor device 120. Accordingly, the yellowing problem of the resin material 125 by the heat can be inhibited.

Since the paste member 140 contains the reflective metal, it can reflect some of the light emitted from the semiconductor device 120 or vary a critical angle of the light. Accordingly, an amount of the light reflected on the light emitting diode package can be improved.

Figure 4:
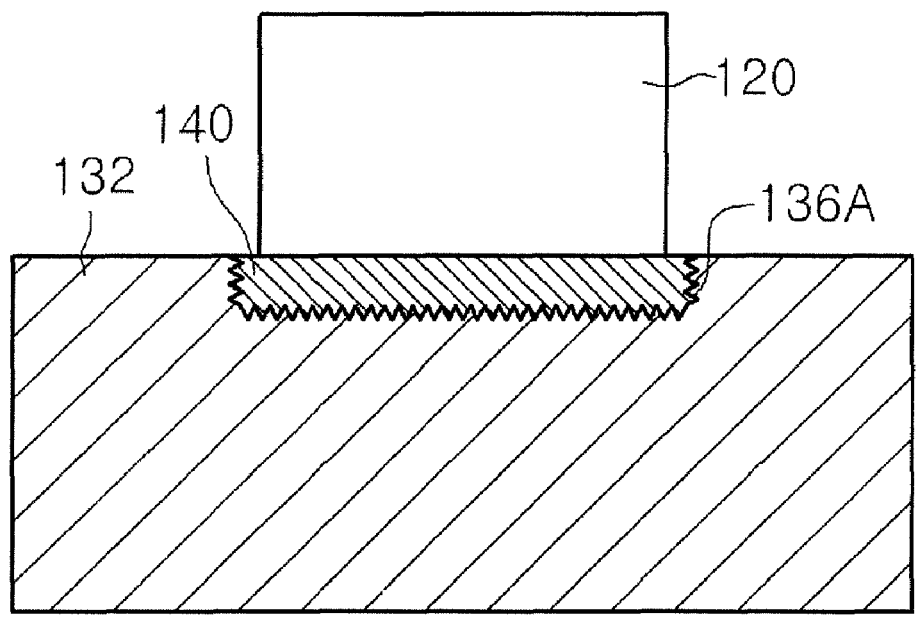
FIG. 4 is a cross-sectional view illustrating a semiconductor device package according to a second embodiment.

FIG. 4 is a cross-sectional view illustrating a semiconductor device package according to a second embodiment. Parts that are already described in the first embodiment will not be described in this second embodiment.

Referring to FIG. 4, a semiconductor device package of this second embodiment comprises a first electrode 132 on which paste grooves 136A formed in a protrusion/groove structures are formed.

A paste member 140 is formed in the paste groove 136A. A contact area of the paste member 140 with the first electrode 132 can be increased by the protrusion/groove structures. Therefore, the heat generated by the semiconductor device 120 can be effectively dissipated and vary a critical angle of the light emitted from the LED chip or reflect or refract the light.

Figure 5:
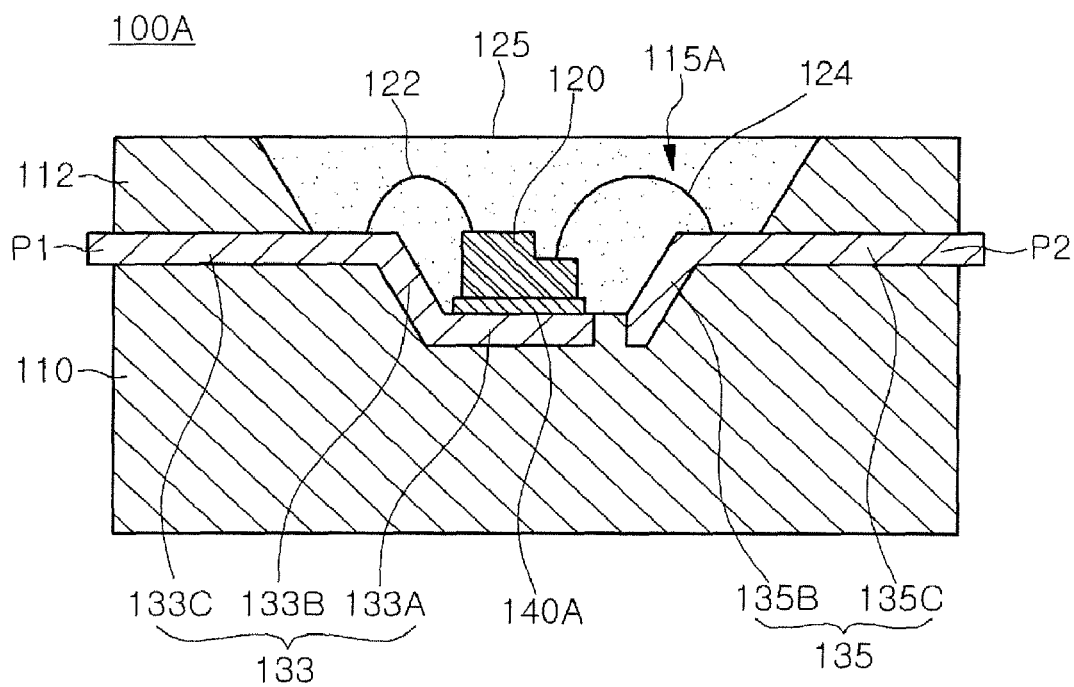
FIG. 5 is a cross-sectional view illustrating a semiconductor device package according to a third embodiment.

FIG. 5 is a cross-sectional view illustrating a semiconductor device package according to a third embodiment. Parts that are already described in the first embodiment will not be described in this third embodiment.

Referring to FIG. 5, a semiconductor device package 100A comprises a multi-layered cavity 115A and a paste member 140A formed on a top surface of a first electrode 133. First and second electrodes 133 and 135 are disposed on the cavity 115A. A first end 133A of the first electrode 133 is disposed on a lower-layer bottom surface of the cavity 115A and a semiconductor device 120 is die-bonded on the first end 133A of the first electrode 133.

The semiconductor device 120 is die-bonded by the paste member 140A formed on the top surface of the first electrode 133. The paste member 140A is formed on the top surface of the first end 133A of the first electrode 133. In this case, the heat dissipation efficiency can be improved in accordance with an area of the paste member 140A. The description of the paste member 140A will refer to the first embodiment.

A first end 135B of the second electrode 135 and a middle end 133B of the first electrode 133 are obliquely disposed at a lower layer of the cavity 115A to improve the light reflection.

A second end 133C of the first electrode 133 and a second end 135C of the second electrode 135 are exposed through middle and top ends of the cavity 115A.

A transparent resin material 125 is formed in the cavity 115A. Phosphors may be added to the resin material 125. The resin material 125 may be provided at the lower cavity structure with a phosphor layer. A transparent resin layer may be formed in the cavity structure. However, the present disclosure is not limited to this.

Here, a plurality of wires 122 and 124 have first ends connected to the semiconductor device 120 and second ends connected to a second end 133C of the first electrode 133 and a second end 135C of the second electrode 135. Accordingly, a heat dissipation path of the semiconductor device 120 may be dispersed.

The paste member 140A comprises a reflective metal and inorganic fillers and thus the heat generated by the semiconductor device 120 can be dissipated through the first electrode 132.

Figure 6:
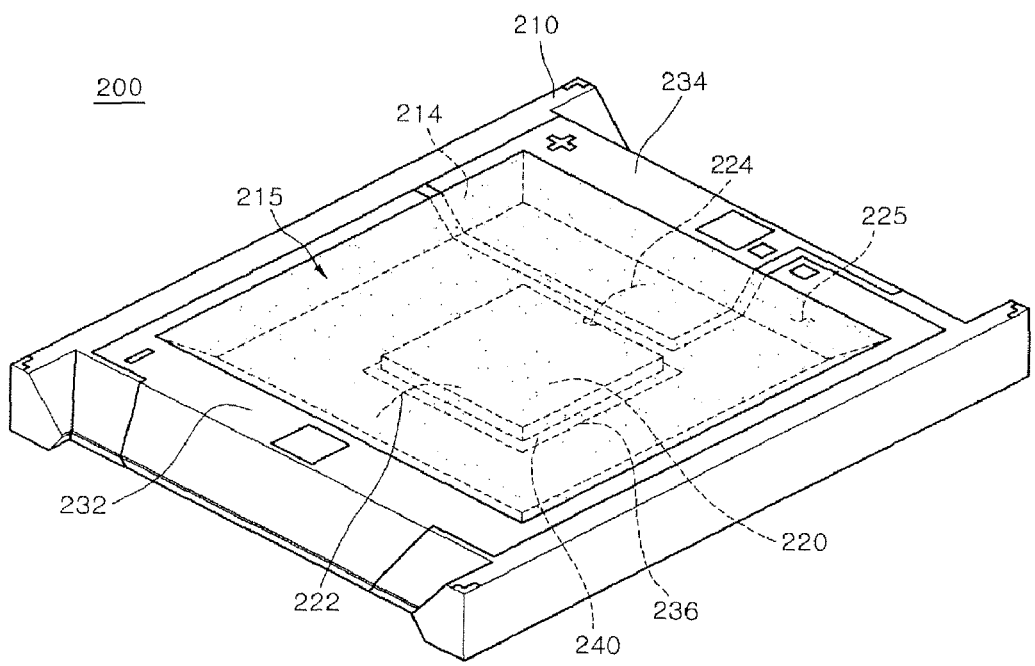
FIG. 6 is a perspective view illustrating a semiconductor device package according to a fourth embodiment.
Figure 7:
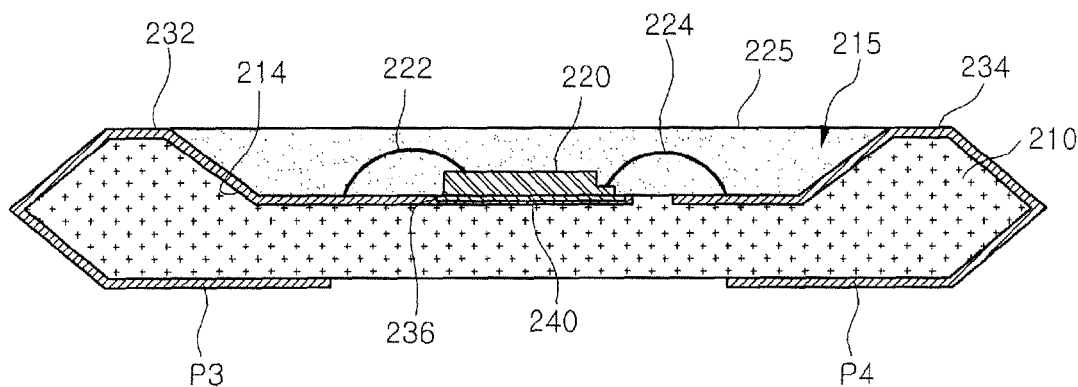
FIG. 7 is a side sectional view of FIG. 6.

FIG. 6 is a perspective view illustrating a semiconductor device package according to a fourth embodiment and FIG. 7 is a side sectional view of FIG. 6. Parts that are already described in the first embodiment will not be described in this fourth embodiment.

Referring to FIGS. 6 and 7, a semiconductor device package 200 comprises a package body 210, a cavity 215, a plurality of electrodes 232 and 234, a paste member 240, a semiconductor device 220, and a resin material 225.

The package body 210 is a silicon-based wafer level package (WLP) formed in a polyhedron shape.

A cavity 215 having a predetermined depth may be formed in an upper portion of the package body 210. A perimeter of the package body 210 may be inclined. However, the present disclosure is not limited to this.

The electrodes 232 and 234 may be formed on a surface of the package body 210. For instance, the electrodes 232 and 234 may be formed on a top surface (comprising a cavity region), side surface, and rear surface of the package body 210.

The electrodes 232 and 234 may be formed in a plating type and/or and/or a via-hole type. A reflective material may be coated on a top surface of the electrodes 232 and 234. Here, an insulating layer (not shown) may be formed between the package body 210 and the electrodes 232 and 234. However, the present disclosure is not limited to this.

First ends of the electrodes 232 and 234 are disposed in the cavity 215 and spaced apart from each other.

The electrode 232 is provided with a paste groove 236. The paste groove 236 may be formed with a predetermined depth by dry-etching or wet-etching of the electrode 232. The paste groove 236 may be formed in a circular shape, a polygonal shape, or a random shape.

A size of the paste groove 236 may be equal to or greater than a bottom surface of the semiconductor device 220. The semiconductor device 220 may be at least one LED chip.

The depth of the paste groove 236 may be 1-100 μm from the top surface of the electrode 232.

A paste member 240 is formed in the paste groove 236. The paste member 240 may be formed through one of a dotting process, a stamping process, and a dispensing process.

The paste member 240 may be formed of an organic paste material to which metal powder is added. The paste member 240 may be formed of organic resin to which inorganic fillers and/or metal powder is added at a predetermined ratio.

The organic resin contains silicon or epoxy resin. The inorganic filler contains high reflective white inorganic fillers such as $TiO_2$. The reflective metal may contain metal powder such as Ag and Al that are excellent in a reflective property and thermal conduction. The paste member 140 may be formed of the organic resin mixed with 0.1-30 wt % of the inorganic fillers and/or 0.1-30 wt % of the metal powder.

The paste member 240 is applied on the paste groove 236 and the semiconductor device 220 is die-bonded on the paste member 240. The semiconductor device 220 is connected to the electrodes 232 and 234 by wires 222 and 224.

Heat generated by the semiconductor device 220 is conducted to the electrode 232 by the paste member 240. Therefore, a junction temperature between the semiconductor device 220 and the paste member 240 can be reduced.

Here, the shape, size, and number of the paste member 240 in the cavity 215 may be varied in accordance with the shape, size, and number of the semiconductor device 220. For example, when a plurality of the semiconductor devices 220 are provided, the paste member 240 may be formed in a large size or a plurality of the paste members 240 may be provided.

The resin material 225 is formed in the cavity 215. The resin material 225 comprises transparent silicon or epoxy. Phosphors may be added to the resin material 225. A lens (not shown) for refracting light in a predetermined direction may be disposed on the resin material 225.

Further, a protective device such as a Zener diode for protecting the semiconductor device (i.e., LED) 220 may be provided on the package body 210.

When electric power is applied from the electrodes 232 and 234, the semiconductor device 220 is driven to generate heat. The heat generated by the semiconductor device 220 is conducted to the electrode 232 through the paste member 240 and then dissipated. Further, when the semiconductor device 220 is an LED chip, the light emitted from the LED chip is partly reflected or refracted by the paste member 240.

The heat generated by the semiconductor device 220 is conducted to the electrode 232 through the paste member 240 and then dissipated. Therefore, the yellowing problem of the resin material 225 contacting the semiconductor device 220 can be solved. Further, a contact area of the paste member 240 with the resin material 225 is reduced and a contact area of the paste member 240 with the electrode 132 is increased. Therefore, the heat dissipation efficiency of the paste member 240 can be enhanced.

Figure 8:
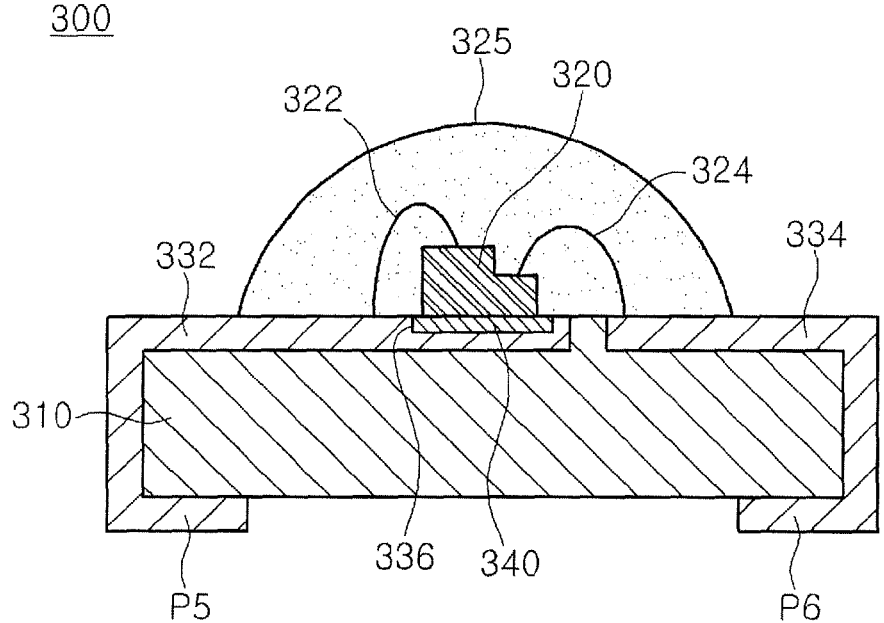
FIG. 8 is a cross-sectional view illustrating a semiconductor device package according to a fifth embodiment.

FIG. 8 is a cross-sectional view illustrating a semiconductor device package according to a fifth embodiment. Parts that are already described in the first embodiment will not be described in this fifth embodiment.

Referring to FIG. 8, a semiconductor package 300 comprises a package body 310, a semiconductor device 320, a plurality of electrodes 332 and 334, wires 322 and 324, a resin material 325, and a paste member 340.

The electrodes 332 and 334 are formed on the package body 310. The electrodes 332 and 334 may be formed by selectively using a lead frame type, a PCB type, a ceramic type, a plating type, or a via-hole type.

The electrode 332 may extend to one side of the top surface of the package body 310, a left side surface of the package body 310, and a rear surface of the package body 310. The second electrode 334 may extend to the other side of the top surface of the package body 310, a right side surface and rear surface of the package body 310. A rear electrode of the package body 310 may be used as external electrodes P5 and P6.

A paste groove 336 is formed on a top surface of the first electrode 332 and the paste member 340 is formed in the paste groove 336. The paste member 340 may be mixed with metal powder and/or a white inorganic fillers. The paste member 340 corresponds to the paste member 140 of the first embodiment.

At least one semiconductor device 320 is die-bonded on the paste member 340. The semiconductor device 320 may be an LED chip and electrically connected to the electrodes 332 and 334 by the wires 322 and 324.

The resin material 325 may be formed in a lens shape using silicon or epoxy resin. The resin material 325 seals the semiconductor device 320 and the wires 322 and 324. The resin material 325 can refract the light emitted from the LED chip in a predetermined direction.

When the semiconductor device 320 is driven, a portion of the heat generated by the semiconductor device 320 is conducted to the electrode 332 through the paste member 340 and is then dissipated. Here, a via-hole (not shown) may be formed through the electrode 332 and extend to a bottom surface of the package body 310. The via-hole functions to dissipate the heat through a lower portion of the package body 310.

Figure 9:
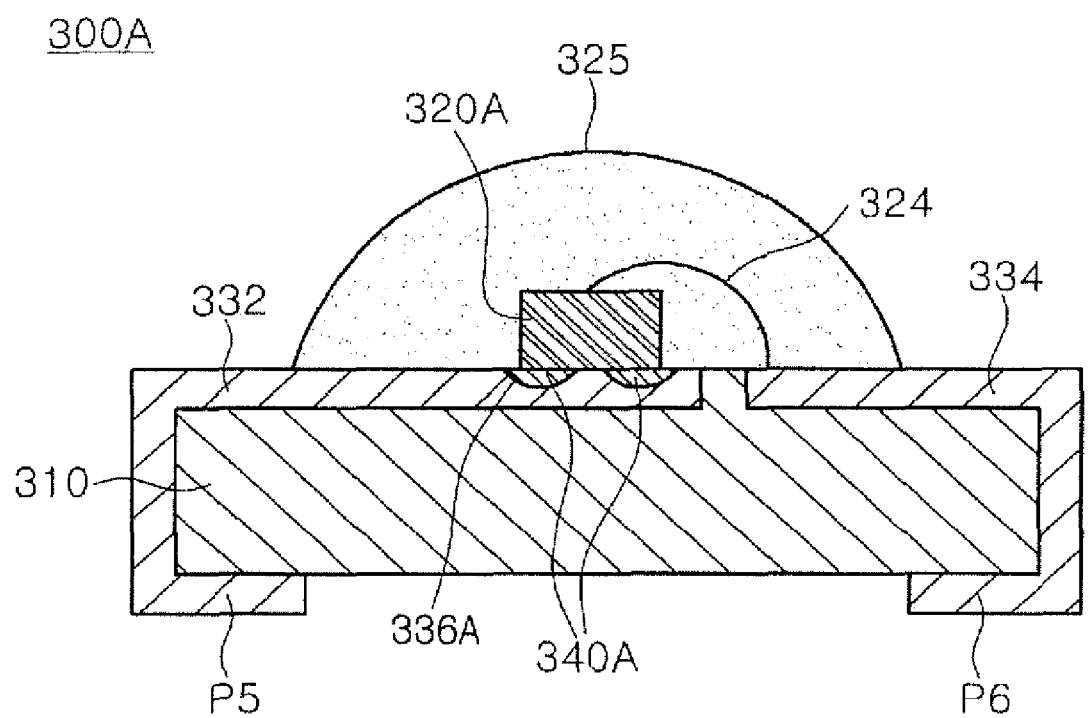
FIG. 9 is a cross-sectional view illustrating a semiconductor device package according to a sixth embodiment.

FIG. 9 is a cross-sectional view illustrating a semiconductor device package according to a sixth embodiment. Parts that are already described in the first embodiment will not be described in this sixth embodiment.

Referring to FIG. 9, a semiconductor package 300A comprises a package body 310, a paste member 340A, a semiconductor device 320A, a plurality of electrodes 332 and 334, a paste groove 336A, and a resin material 325.

The paste groove 336A is formed in the electrode 332 of the package body 310. The paste groove 336A may be formed in a plurality of stripe shapes, ring shapes, or donut shapes.

The paste member 340A is formed in the paste groove 336A. A portion of the electrode 332 is exposed in the paste groove 336A and a conductive adhesive may be applied on a portion of the electrode 332. The semiconductor device 320A may be die-bonded on the paste member 340A by the conductive adhesive. That is, both organic paste member and conductive paste member may be used as the die paste member.

When the semiconductor device 320A is a large-sized LED chip, a bottom electrode of the LED chip is electrically connected to the electrode 332 and also connected to the electrode 334 by a wire 324. Here, the bottom electrode of the LED chip may be an N-type or P-type electrode.

According to the embodiment, when the semiconductor device such as the LED chip is packaged, the heat generated by the semiconductor device can be effectively dissipated by the thermal conductive paste member. In addition, the light emitted from the LED chip can be reflected by the paste member containing the metal powder. The semiconductor device package using the LED chip may be used as a light source of a front light and/or backlight of a liquid crystal display device and as lightings.

Embodiments provide a semiconductor device package.

Embodiments provide an LED package.

Embodiments also provide an LED package that can be used as a light source for a variety of fields such as lighting displays, letter displays and image displays.

According to the embodiments, heat dissipation of a semiconductor device such as an LED chip can be improved by a paste member containing reflective metal.

In addition, since light emitted from an LED chip can be reflected by the paste member containing a reflective metal and/or inorganic fillers, the amount of light reflected can be increased.

Further, a yellowing problem of resin material can be solved by reducing a contact area between the paste member and the resin material.

In addition, the reliability of a semiconductor device package on which an LED chip and/or a protective member are mounted can be improved.

In the above description, it will be understood that when a layer (or film) is referred to as being 'on' another layer or substrate, it can be directly on the another layer or substrate, or intervening layers may also be present. Further, it will be understood that when a layer is referred to as being 'under' another layer, it can be directly under the another layer, or one or more intervening layers may also be present. In addition, it will also be understood that when a layer is referred to as being 'between' two layers, it can be the only layer between the two layers, or one or more intervening layers may also be present.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor device package comprising:
   a package body;
   a plurality of electrodes comprising a first electrode on the package body;
   a paste member on the first electrode and comprising at least one of inorganic fillers and metal powder; and
   a semiconductor device die-bonded on the paste member, wherein a die-bonding region of the first electrode comprises a paste groove having a predetermined depth and the paste member is formed in the paste groove, and
   wherein the paste member is organic resin comprising the inorganic fillers and the metal powder.

2. The semiconductor device package according to claim 1, wherein the inorganic fillers comprise $TiO_2$ and the metal powder comprises at least one of aluminum (Al) and silver (Ag).

3. The semiconductor device package according to claim 1, wherein the semiconductor device comprises at least one light emitting diode chip.

4. The semiconductor device package according to claim 3, further comprising:
   a cavity disposed at the package body for accommodating the electrodes and the light emitting diode chip;
   a wire electrically connecting the light emitting diode chip to the electrodes; and
   a transparent resin material in the cavity.

5. The semiconductor device package according to claim 1, further comprising a resin material for sealing the electrodes and the semiconductor device.

6. The semiconductor device package according to claim 1, wherein a bottom surface and an outer circumference of the paste member make contact with the first electrode.

7. A semiconductor device package comprising:
   a package body comprising a cavity;
   a plurality of electrodes comprising a first electrode in the cavity;
   a paste member on the first electrode and comprising white inorganic fillers and a reflective metal;
   at least one light emitting diode chip die-bonded on the paste member;
   a wire electrically connecting the electrodes to the light emitting diode chip; and
   a resin material in the cavity.

8. The semiconductor device package according to claim 7, wherein the first electrode comprises a paste groove in which the paste member is disposed.

9. The semiconductor device package according to claim 8, wherein the paste groove has a depth of about 1 μm to about 100 μm from a top surface of the first electrode.

10. The semiconductor device package according to claim 9, wherein the paste groove is larger than a bottom area of the light emitting diode chip and comprises protrusion/groove structures.

11. The semiconductor device package according to claim 8, wherein the paste groove is formed in one of a plurality of stripe shapes, a ring shape, and a circular shape.

12. The semiconductor device package according to claim 7, wherein the electrodes comprise at least one of a lead frame type electrode, a circuit board type electrode, a ceramic type electrode, a plating type electrode, and a via-hole type electrode; and
the package body comprises at least one of polyphthalamide (PPA), a liquid crystal polymer, a resin comprising syndiotactic polystyrene, a metal core printed circuit board (MCPCB), a printed circuit board (PCB), a ceramic PCB, flame retardant 4 (FR-4), and aluminum nitride (AlN).

13. The semiconductor device package according to claim 7, wherein the paste member comprises silicon or epoxy;
the white inorganic fillers comprises $TiO_2$;
the reflective metal comprises at least one of aluminum (Al) and silver (Ag); and
at least one of the white inorganic fillers and the reflective metal is mixed in the paste member at a concentration of about 0.1% to about 30% by weight.

14. A semiconductor device package comprising:
a light emitting diode chip;
a first electrode under the light emitting diode chip;
a second electrode spaced apart from the first electrode;
an organic paste member on the first electrode and comprising inorganic fillers and a reflective metal comprising metal powder, the light emitting diode chip being die-bonded on the organic paste member; and
a connecting member electrically connecting the light emitting diode chip to the electrodes,
wherein the first electrode comprises at least one paste groove in which the paste member is disposed.

15. The semiconductor device package according to claim 14, further comprising a package body under the first and second electrodes; and
a single or multi-layered cavity on the package body, the light emitting diode chip being disposed in the cavity.

16. The semiconductor device package according to claim 15, further comprising a transparent resin material or a fluorescent material containing transparent resin material in the cavity.

17. The semiconductor device package according to claim 14, wherein the paste member is an organic resin material, wherein the inorganic fillers comprise $TiO_2$, and wherein the metal powder comprises at least one of Al and Ag.

* * * * *